United States Patent [19]

Kunishima et al.

[11] Patent Number: 5,316,977
[45] Date of Patent: May 31, 1994

[54] METHOD OF MANUFACTURING A SEMICONDUCTOR DEVICE COMPRISING METAL SILICIDE

[75] Inventors: Iwao Kunishima, Kawasaki; Kyoichi Suguro, Yokohama, both of Japan

[73] Assignee: Kabushiki Kaisha Toshiba, Kawasaki, Japan

[21] Appl. No.: 913,704

[22] Filed: Jul. 16, 1992

[30] Foreign Application Priority Data

Jul. 16, 1991 [JP] Japan .................................. 3-175586
Jun. 29, 1992 [JP] Japan .................................. 4-171094

[51] Int. Cl.⁵ ................. H01L 21/223; H01L 21/225; H01L 21/283
[52] U.S. Cl. .................................... 437/200; 437/160; 437/162; 437/165; 437/247; 148/DIG. 19; 148/DIG. 147
[58] Field of Search ............... 437/200, 162, 160, 247, 437/949, 165, 166; 357/675, 715; 148/DIG. 147, DIG. 19; 257/382, 383, 384, 757

[56] References Cited

U.S. PATENT DOCUMENTS

| 3,887,993 | 6/1975 | Okada et al. | 148/DIG. 147 |
|---|---|---|---|
| 4,353,737 | 10/1982 | Ray | 75/0.5 R |
| 4,465,529 | 8/1984 | Arima et al. | 437/165 |
| 4,536,943 | 8/1985 | Kakumu | 437/165 |
| 4,558,507 | 12/1985 | Okabayashi et al. | 437/200 |

FOREIGN PATENT DOCUMENTS

| 0431721 | 6/1991 | European Pat. Off. | |
| 60-138916 | 7/1985 | Japan | 437/200 |
| 61-225838 | 10/1986 | Japan | 437/200 |
| 1-238144 | 9/1989 | Japan | 148/DIG. 147 |

OTHER PUBLICATIONS

Wolf, et al., Silicon Processing, Lattice Press, 1986, vol. 1, pp. 264-267, 384-405.
Journal of the Electrochemical Society, vol. 128, No. 11, Nov. 1981, pp. 2402-2410, S. Inoue, et al., "Phosphorous-Doped Molybdenum Silicide Films for LSI Applications".
J. Electrochem. Soc., vol. 139, No. 1, Jan. 1992 pp. 196-206, H. Jiang, et al., Ultra Shallow Junction Formation Using Diffusion from Silicides: Silicide Formation Dopant Implantion and Depth Profiling.
Solid-State Electronic, vol. 32, 1989, pp. 385-389, T. Larsson, et al. Si/Ti/TiB2/Al Structures Investigated as Contacts in Microelectronic Devices.

Primary Examiner—T. N. Quach
Attorney, Agent, or Firm—Oblon, Spivak, McClelland, Maier & Neustadt

[57] ABSTRACT

According to this invention, a method of manufacturing a semiconductor device includes the steps of forming an impurity diffusion layer of a second conductivity type on a semiconductor substrate of a first conductivity type, forming a transitition layer containing a constituent element of the semiconductor substrate on the impurity diffusion layer, and doping an impurity of the second conductivity type in the metal compound layer by annealing in a reducing atmosphere. A semiconductor device includes a semiconductor substrate of a first conductivity type, an impurity diffusion layer of a second conductivity type formed in the semiconductor substrate of the first conductivity type, and a conductive metal compound layer formed on the impurity diffusion layer, wherein the conductive metal compound layer consists of at least a transition metal, a semiconductor element, and an impurity element of the second conductivity type which is an impurity element of the second conductivity type, and the impurity element of the second conductivity in the conductive metal compound layer is uniformly distributed.

13 Claims, 11 Drawing Sheets

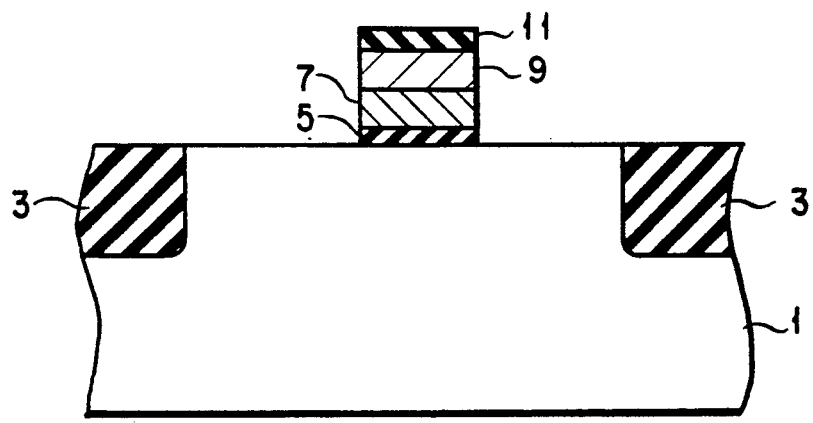
F I G. 2A
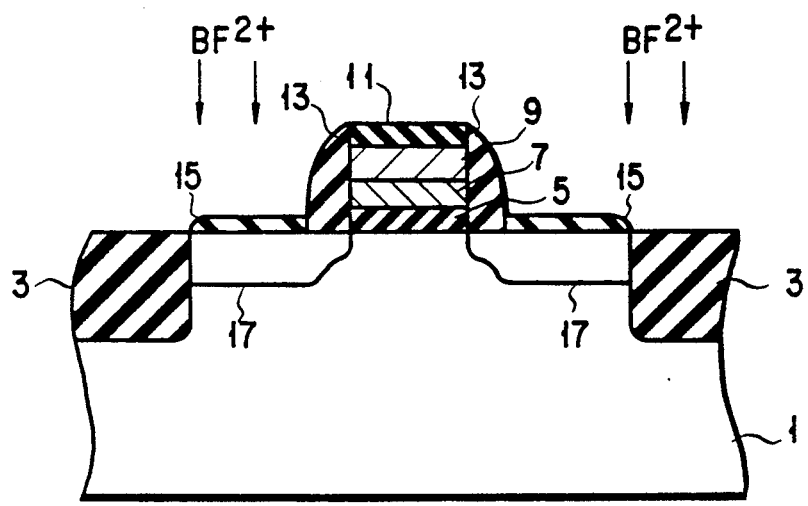
F I G. 2B
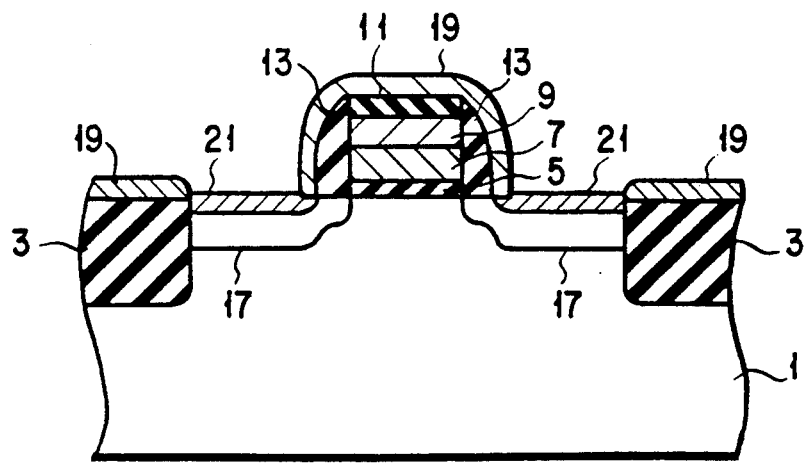
F I G. 2C

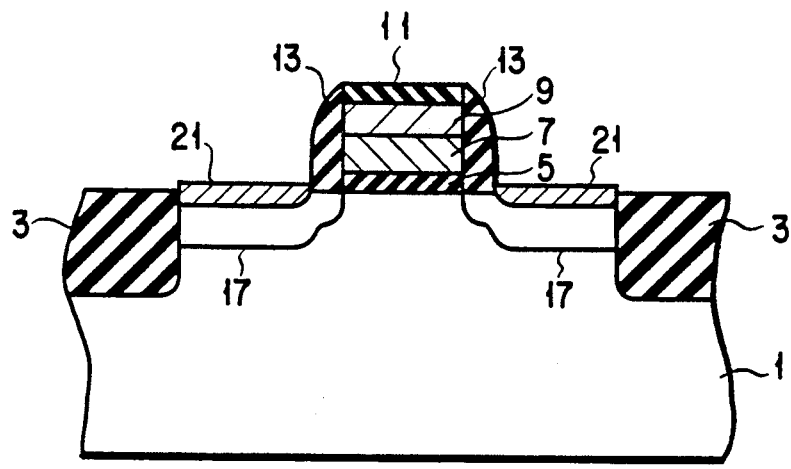
F I G. 3A
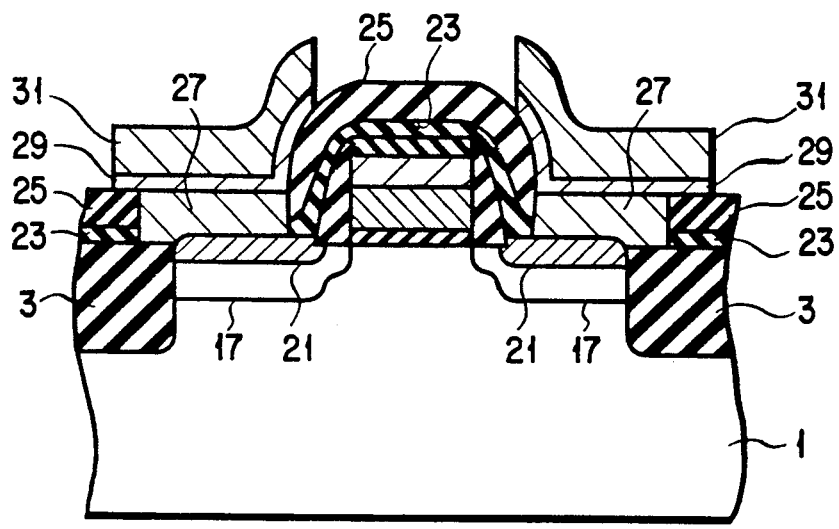
F I G. 3B

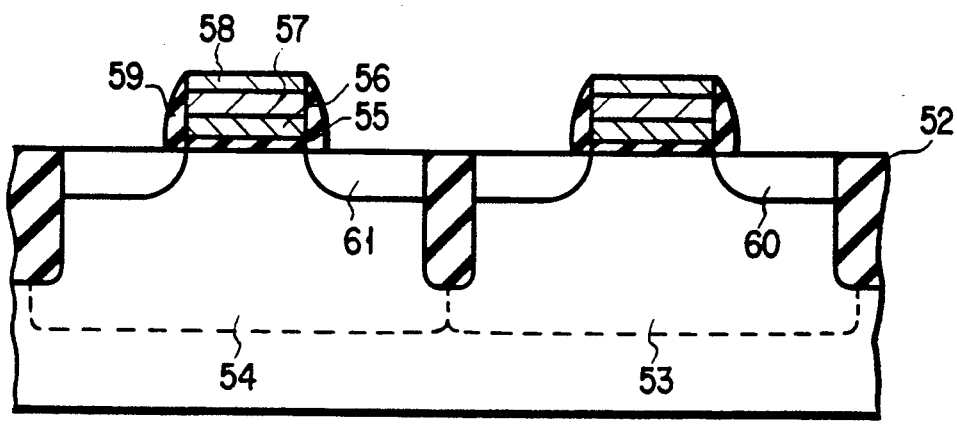
F I G. 9A
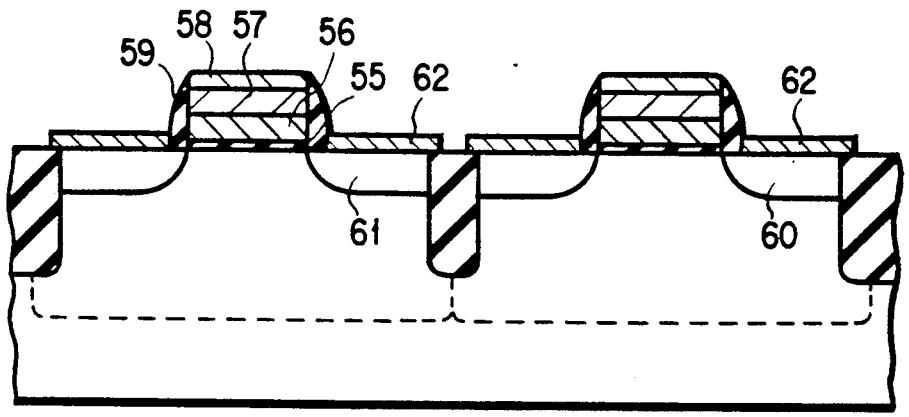
F I G. 9B
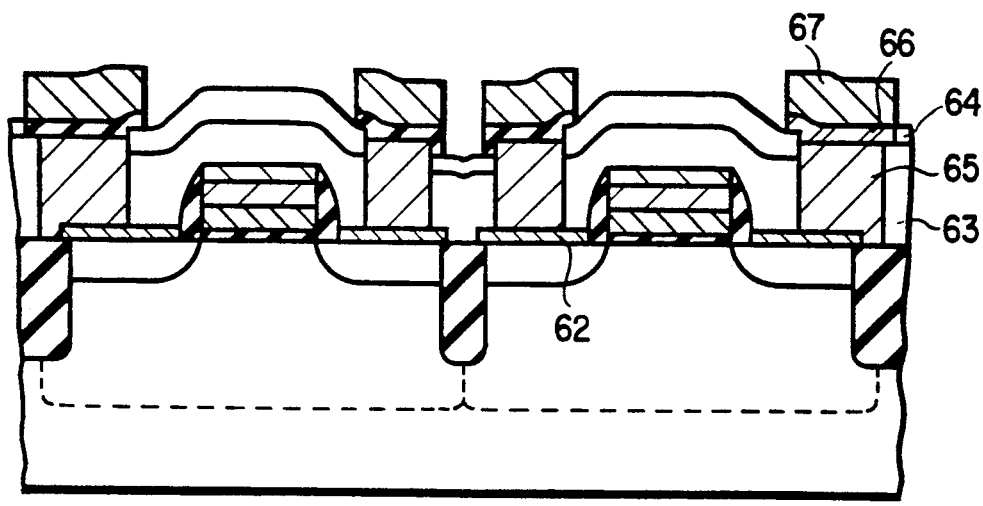
F I G. 9C

METHOD OF MANUFACTURING A SEMICONDUCTOR DEVICE COMPRISING METAL SILICIDE

BACKGROUND OF THE INVENTION

1. Field of the Invention

The present invention relates to a method of manufacturing a semiconductor device and, more particularly, to a method of manufacturing a semiconductor device having a shallow impurity layer.

2. Description of the Related Art

In recent years, electric circuits consisting of a large number of transistors and resisters are arranged in the main portion of a computer or communication equipment, and a large scale integrated circuit (LSI) obtained by integrating the large number of transistors and resistors in one chip is frequently used as the electric circuit. The improvement of the performance of one LSI is important to design high-performance equipment. Since this improvement can be achieved by increasing a degree of integration of, e.g., an LSI, a field effect transistor (FET) must be micro-patterned. For this purpose, when the length of each gate of the FET is decreased, source and drain regions must be shallow. For example, low-acceleration ion implantation is popularly used for forming these regions. In this method, shallow source and drain regions each having a depth of about 0.1 $\mu$m can be formed, and a micro-patterned FET having high performance can be formed.

However, an impurity layer formed by only the ion implantation has a high resistance, i.e., a sheet resistance of 100$\Omega$/□ or more. In order to increase the speed of the FET, the sheet resistance of the impurity layer must be decreased to cause a drain current to properly flow.

When the diameter of a contact hole is decreased, Si contained in an A$\lambda$-Si-Cu alloy used as an electrode wiring material is precipitated in the contact hole to cause an increase in contact resistivity.

In order to solve the above two problems, a method of metallizing a part of the impurity layer or the inside of the contact hole is considered. For example, a method called silicide is used.

According to this method, after a field oxide film 83 is formed on a (100) Si substrate 81, a gate oxide film 85, a gate electrode 87, and a gate side-wall insulating film 89 (thickness of about 150 nm) are formed on the field oxide film 83. An impurity diffusion layer 91 is formed in the surface of the Si substrate 81 by well-known ion implantation, and a titanium (Ti) film 93 is deposited on the entire surface of the resultant structure to have a thickness of 40 nm.

As shown in FIG. 1B, the surface of the Si substrate 81 is heated by lamp annealing, a silicide film, i.e., a titanium silicide (TiSi$_2$) film 9, is formed in the surface layer of the impurity diffusion layer 91.

As shown in FIG. 1C, after the non-reacted Ti film 93 is removed by etching, an insulating film 97 is formed. Finally, contact holes are formed in the insulating film 97, and electrode wiring layers 99 are formed, thereby obtaining an FET.

According to this method, the TiSi$_2$ film 95 having a thickness of 80 nm can be formed, and the sheet resistance can be decreased to about 2 to 3$\Omega$/□.

However, recent extensive studies have pointed out the following problems of a method of this type.

The depth of a diffusion layer must be set to be 0.1 $\mu$m or less to form an FET having a gate length of 0.3 $\mu$m or less. Boron (B) used for forming a p$^+$-type diffusion layer has a diffusion coefficient smaller than that of arsenic (As) used for forming an n$^+$-type diffusion layer. For this reason, in order to form such a shallow p$^+$-type diffusion layer by using B, annealing must be performed at a low temperature of about 850° C.

When the TiSi$_2$ film 95 is formed by the above method, however, B ions in a high-concentration region formed on the surface of the Si substrate are consumed for forming the TiSi$_2$ film 95. It is found that the B concentration of a TiSi$_2$/Si interface is considerably decreased.

For example, when the p$^+$-type diffusion layer is formed by annealing at 850° C using ion implantation of BF$_2$, the B concentration of the TiSi$_2$/Si interface is a low value, i.e., $3 \times 10^{19}$ cm$^{-3}$ or less. On the other hand, high-temperature annealing in a POC$\lambda_3$ gas atmosphere at 850° C. for 60 minutes may be performed to the reliability of the element after the TiSi$_2$ film is formed. However, in this case, the B concentration of the TiSi$_2$/Si interface is further decreased. As a result, the contact resistivity of the electrode wiring layer to the p$^+$-type diffusion layer is very large value, i.e., $1 \times 10^{14}$ $\Omega \cdot$cm$^2$ or more, ohmic and electric connection cannot be obtained between the p$^+$-type diffusion layer and the electrode wiring layer.

As a countermeasure against the above problem, the following attempt is made. That is, after the TiSi$_2$ film 95 is formed, B or BF$_2$ ions are implanted near the TiSi$_2$/Si interface from the upper surface of the TiSi$_2$ film 95, and the resultant structure is annealed in a nitrogen atmosphere to increase the B concentration of the TiSi$_2$/Si interface.

However, B ions must be implanted at a high acceleration voltage of 30 keV or more to use this method, and a p$^+$-type diffusion layer is deeply formed under the TiSi$_2$ film 95. For this reason, the method cannot be applied to a micro-patterned device requiring a shallow junction, and Ti ions in the TiSi$_2$ film 95 are knocked in the Si substrate 81 by performing the ion implantation at a high acceleration voltage, i.e., a knock-on phenomenon occurs. Therefore, defects are formed in the diffusion layer and junction leakage is increased, resulting in inconvenience.

When a wiring layer obtained by stacking a metal compound layer such as a TiSi$_2$ layer on a polysilicon layer containing an impurity such as B is to be formed, since the impurity is consumed, the wiring resistance of the polysilicon layer is increased.

On the other hand, the salicide method is also applied to a complementary MOS (CMOS)-FET. That is, in this case, the complementary CMOS-FET is manufactured by the step shown in FIG. 12 except for formation of p$^+$-and n$^+$-type impurity diffusion layers in the surface layer of the Si substrate 81. In this case, since the contact resistivity of the electrode wiring layer to the p$^+$-type diffusion layer has a very large value, i.e., $1 \times 10^{-4}\Omega \cdot$cm$^2$ or more, ohmic and electric connection cannot be obtained between the p$^+$-type diffusion layer and the electrode wiring layer.

In order to solve this problem, the following semiconductor device is proposed. In this semiconductor device, metal silicide films of different types are formed on the p$^+$-type diffusion layer and the n$^+$-type diffusion layer of the CMOS-FET, respectively. For example, a platinum silicide film is formed on the p$^+$-type diffusion layer and a Ti silicide film is formed on the n$^+$-type diffusion layer. However, since the number of steps in manufacturing the semiconductor device is very large, an inexpensive high-performance CMOS-FET cannot be obtained.

As described above, when the shallow p+-type diffusion layer having a thickness of 0.1 μm or less is formed, in a conventional salicide method, an impurity concentration of the interface between a $TiSi_2$ film and a p+-type diffusion layer is decreased in proportion to an increase in time for high-temperature annealing. For this reason, a contact resistance is increased, and it is difficult to properly perform electric connection between the p+-type diffusion layer and an electrode wiring layer. In addition, when an impurity is doped in the interface between the p+-type diffusion layer and the Si substrate by ion implantation, the following new problems are posed. That is, the depth of junction is increased, and at the same time, junction leakage is increased.

In addition, the resistance is disadvantageously increased by consuming an impurity even in a stacked wiring layer consisting of a polysilicon film and a $TiSi_2$ film.

SUMMARY OF THE INVENTION

The present invention has been made in consideration of the above circumstances, and has as its object to provide a method of manufacturing a semiconductor device having high reliability, which is not degraded by junction leakage or the like, and a sufficiently low resistance of a contact between an electrode wiring layer and a shallow diffusion layer. Furthermore, it is another object of the present invention to provide a semiconductor device capable of obtaining both low-resistance p+- and n+-type contacts which are stable after high-temperature annealing is performed.

According to the first aspect of the present invention, there is provided a method of manufacturing a semiconductor device comprising the steps of forming an impurity diffusion layer of a second conductivity type on a semiconductor substrate of a first conductivity type, forming a metal compound layer containing a constituent element of the semiconductor substrate on the impurity diffusion layer, doping an impurity of the second conductivity type in the metal compound layer, and annealing the resultant structure in a reducing atmosphere. In this case, the doping of the impurity and the annealing in the reducing atmosphere may be performed in this order or simultaneously performed.

According to the second aspect of the present invention, there is provided a method of manufacturing a semiconductor device comprising the steps of forming an impurity diffusion layer of a second conductivity type on a semiconductor substrate of a first conductivity type, forming a metal compound layer containing a constituent element of the semiconductor substrate on the impurity diffusion layer, and doping an impurity of the second conductivity type in the metal compound layer from a gas containing the impurity of the second conductivity type.

According to the third aspect of the present invention, there is provided a method of manufacturing a semiconductor device comprising the steps of forming an impurity diffusion layer of a second conductivity type on a semiconductor substrate of a first conductivity type, forming a thin film consisting of a transition metal on the impurity diffusion layer, and annealing the semiconductor substrate having the thin film thereon in an atmosphere containing an impurity element of the second conductivity type to cause the transition metal to react with a semiconductor constituent element of the semiconductor substrate and to dope the impurity element of the second conductivity type.

According to the fourth aspect of the present invention, there is provided a semiconductor device comprising a semiconductor substrate of a first conductivity type, an impurity diffusion layer of the second conductivity type formed in the semiconductor substrate of the first conductivity type, and a conductive metal compound layer formed on the impurity diffusion layer, wherein the conductive metal compound layer consists of at least a transition metal, a semiconductor element, and an impurity element of the second conductivity type, which is an impurity element of the second conductivity type, and a concentration of the impurity element of the second conductivity in the conductive metal compound layer as a whole is not less than $2 \times 10^{20}$ cm$^{-3}$, more preferably $5 \times 10^{20}$ cm$^{-3}$.

According to the fifth aspect of the present invention, there is provided a semiconductor device comprising a semiconductor substrate serving as a complementary MOS substrate, a diffusion layer containing an impurity element of a first conductivity type and a diffusion layer containing an impurity element of a second conductivity type, the diffusion layers being formed in the semiconductor substrate, and a conductive metal compound layer having interfaces contacting the two diffusion layers and consisting the impurity elements and a different impurity element whose a bonding energy to a transition element is higher than a bonding energy between the transition element and Si.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A to 2C are sectional views showing the first half of the steps in manufacturing an FET according to an embodiment of the first aspect of the present invention;

FIGS. 3A and 3B are sectional views showing the second half of the steps in manufacturing the FET according to the embodiment of the first aspect of the present invention;

FIGS. 9A to 9C are sectional views showing the steps in manufacturing a CMOS-FET according to an embodiment of the fifth aspect of the present invention;

DETAILED DESCRIPTION OF THE PREFERRED EMBODIMENTS

Figure 1A:
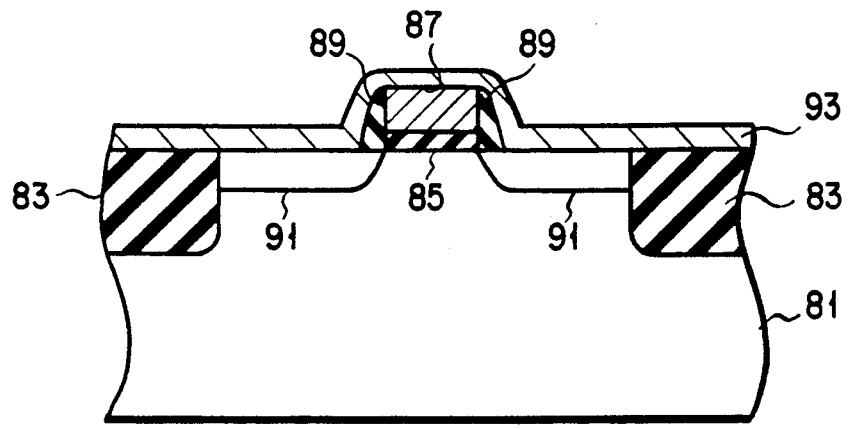
FIGS. 1A to 1C are sectional views showing the steps in manufacturing an FET in a conventional method.
Figure 1B:
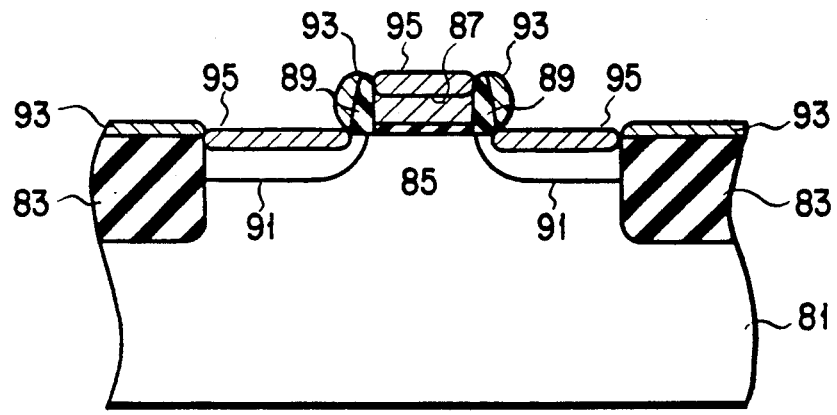
Figure 1C:
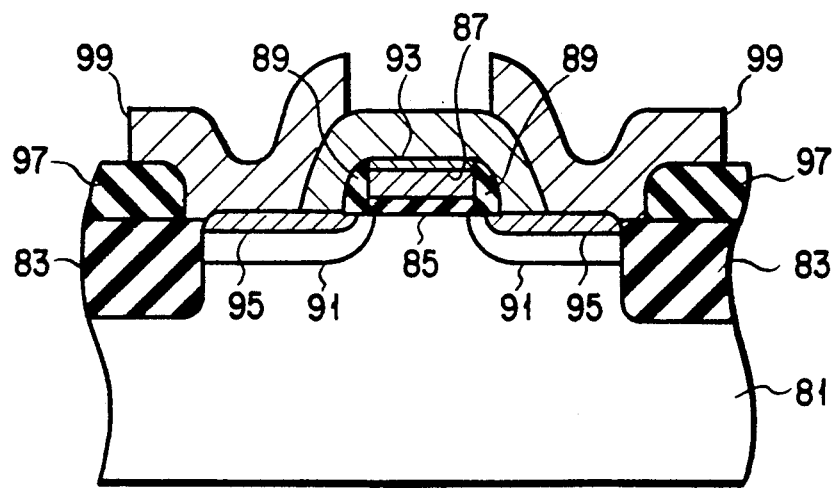

In the first and second aspects of the present invention, $TiSi_2$ and $ZrSi_2$ are used as metal compounds containing constituent elements of a semiconductor substrate. The step of doping an impurity, i.e., the step of thermally diffusing the impurity preferably includes the step of thermally diffusing an impurity of a second conductivity type in a layer consisting of the metal compound and the step of thermally diffusing the impurity from the metal compound layer to the substrate.

The step of thermally diffusing the impurity of the second conductivity type in the metal compound layer is preferably performed by a vapor-phase diffusion or a solid-phase diffusion from a metal impurity film. The solid-phase diffusion is performed by forming a thin film containing the impurity of the second conductivity type on the metal compound layer and diffusing the impurity of the second conductivity type in the metal compound layer. Alternatively, the solid-phase diffusion is performed by diffusing the impurity of the second conductivity type in the metal compound layer while the impurity of the second conductivity type is deposited on the metal compound layer.

As a reducing atmosphere in which the above diffusion is performed, an atmosphere added with hydrogen or carbon monoxide is used. In this case, after the annealing is performed in the reducing atmosphere, it is more preferable that the impurity is thermally diffused in an oxygen atmosphere from the metal compound layer to an impurity diffusion layer.

According to the third aspect of the present invention, Ti, V, W, Mo, Ta, Co, or the like can be used as a transition metal. As a method of forming a thin film consisting of the transition metal, sputtering, CVD, beam evaporation, or the like can be used. The annealing for causing the transition metal to react with the impurity element of the second conductivity type is preferably performed at a temperature of 600° to 850° C. The annealing is not promoted at a temperature of less than 600° C. However, when the temperature is higher than 850° C., heat resistance is degraded.

According to the third aspect of the present invention, an impurity concentration of the conductive metal compound layer as a whole is not less than $2 \times 10^{20}$ $cm^{-3}$, and a difference in a peak concentration near an interface between the conductive metal compound layer and the semiconductor substrate and a minimum concentration in the conductive metal compound layer is less than $10^1$ $cm^{-3}$.

According to this aspect of the present invention, since the impurity of the second conductivity type is thermally diffused in the impurity diffusion layer, the present invention is free from an increase in depth of the layer, defects of the layer, and any damage to the substrate compared with use of ion implantation.

According to the first aspect of the present invention, since a high-concentration impurity is doped in a metal compound layer and annealed in a reducing atmosphere, the metal compound and the impurity are prevented from being combined with and dissociated from each other, thereby uniformly distributing the impurity in the metal compound layer. Therefore, the impurity in the metal compound layer can be supplied to the interface between the metal compound layer and the impurity diffusion layer, the impurity concentration of the interface can be kept to be sufficiently high.

According to the second aspect of the present invention, when an impurity is to be doped from a gas containing the impurity of the second conductivity type in a metal compound layer, since the impurity is uniformly distributed in the metal compound layer without being combined with the metal compound, the same effect as described above can be obtained.

According to the third aspect of the present invention, since an impurity is not diffused outward from an interface between an Si substrate and a metal wiring layer formed on a shallow junction after high-temperature annealing is performed, an increase in contact resistance is prevented.

According to fourth aspect of the present invention, according to forming a $TiSi_2$-B film obtained by uniformly containing high-concentration B atoms in a $p^+$-type Si substrate, Ti-B bonding is saturated, and extraction of B atoms from the substrate is prevented. For this reason, the B concentration of the interface is not decreased, and a thermally stable low-resistance contact can be formed.

According to the fifth aspect of the present invention, a conductive metal compound layer further contains an element such as C, N, or O, having a bonding energy to a transition metal higher than those to the transition metal and Si. For this reason, in a complementary MOS semiconductor device, an impurity element such as B is not diffused in an impurity diffusion layer such as an $n^+$-type Si layer by a concentration gradient, thereby obtaining a stable contact.

As described above, according to the present invention, a shallow high-concentration impurity layer or the like can be formed not to cause degradation of the impurity layer, and a contact resistance between an electrode wiring layer and the impurity layer can be sufficiently decreased.

Examples of the present invention will be described below with reference to the accompanying drawings.

EXAMPLE 1

FIGS. 2A to 3B are sectional views showing the steps in manufacturing an FET according to an embodiment of the first aspect of the present invention.

As shown in FIG. 2A, a field oxide film 3 having a thickness of 800 nm was formed by a burying method on an n-type Si substrate having a (100) plane as a major surface. After a gate oxide film 5 having a thickness of about 10 nm, an impurity-doped polysilicon layer 7 having a thickness of 150 nm, a tungsten silicide ($WSi_2$)

layer 9 having a thickness of 150 nm, and a CVD-SiO$_2$ film 11 were sequentially deposited in an element forming region surrounded by the oxide film 3, the stacked films were etched to have a gate shape, thereby forming a gate electrode.

As shown in FIG. 2B, after a CVD-SiO$_2$ film having a thickness of about 150 nm and serving as an SiO$_2$ spacer 13 was deposited on the entire surface of the resultant structure, the CVD-SiO$_2$ film was anisotropically etched to form the SiO$_2$ spacer 13 on the side wall of the gate electrode. After a thin SiO$_2$ film 15 having a thickness of about 10 nm was formed on an exposed Si surface, BF$_2$+ ions were implanted in the SiO$_2$ film 15 at an acceleration voltage of 35 keV and a dose of $5 \times 10^{15}$ cm$^{-2}$. Thereafter, the Si substrate 1 was annealed in an N$_2$ atmosphere at 850° C. for one hour to form a shallow p+-type impurity diffusion layer 17 having a thickness of about 0.1 μm.

As shown in FIG. 2C, the Si substrate 1 was set in an HF vapor to remove the thin SiO$_2$ film 15 from the p+-type impurity diffusion layer 17, and immediately, the Si substrate was set in a vacuum device. In this manner, a spontaneous oxide film on the Si surface could be prevented from growing. The pressure of the vacuum device was decreased to a very high vacuum of $10^{-8}$ Torr or less, and Ti atoms were deposited by sputtering to form a Ti film 19 having a thickness of about 40 nm. Thereafter, a TiSi$_2$ layer 21 having a thickness of about 80 nm was selectively formed on the exposed Si surface of the resultant structure by annealing the resultant structure in an N$_2$ atmosphere at 600° C. for 15 minutes. The TiSi$_2$ film formed at this time had a C49 phase.

As shown in FIG. 3A, the resultant structure was etched in a solution having a ratio of H$_2$SO$_4$:H$_2$O$_5$=5:1 to remove the non-reacted Ti film 19 deposited on the field oxide film 3 and the SiO$_2$ spacer 13. Thereafter, the Si substrate 1 was annealed in an N$_2$ atmosphere at 900° C. for 30 seconds to change the phase of the TiSi$_2$ layer 21 into a C54 phase having a low sheet resistance.

In this stage, the B concentration of the interface between the TiSi$_2$ layer 21 and the p+-type impurity diffusion layer 17 was measured. It was found that the value was very low, i.e., $3 \times 10^{19}$ cm$^{-3}$. At this time, when a contact resistivity was measured, the value was very high, i.e., $1 \times 10^{-4}$ Ω·cm2 or more. In the stage, ohmic and electronic connection between the p+-type impurity diffusion layer 17 and the electrode wiring layer could not be obtained.

This Si substrate 1 was set in a cold-wall chamber and annealed in a gas mixture atmosphere of Ar gas, H$_2$ gas, and B$_2$H$_6$ gas at 600° C. for 20 minutes. This annealing is called the first annealing step. At this time, the pressure of the chamber was set to be about 0.5 Torr, the flow rate of the H$_2$ gas was set to be 2,000 sccm, and the flow rate of the B$_2$H$_6$ gas was set to be 50 sccm. In addition, the Ar gas was used as a carrier gas (as in the subsequent examples).

The gas mixture was switched to a gas mixture consisting of Ar gas, O$_2$ gas, and B$_2$H$_6$ gas, and the Si substrate 1 was annealed at 800° C. for 10 minutes. This annealing is called the second annealing step. At this time, a pressure was set to be about 0.5 Torr, and the flow rates of the O$_2$ gas and the B$_2$H$_6$ gas were set to be 5 sccm and 10 sccm, respectively.

As shown in FIG. 3B, after stacked films having a thickness of 0.7 μm and consisting of a BPSG film 25 and a CVD-SiO$_2$ film 23 serving as an insulating inter-layer were deposited on the entire surface of the resultant structure, the resultant structure was lamp-annealed in an N$_2$ atmosphere at the atmospheric pressure and 1,000° C. for 10 seconds. This annealing is called the third annealing step.

Finally, contact holes were formed, and an electrode wiring layer having stacked films consisting of a selective CVD-W film 27, a TiN film 29, and an Aλ-Si alloy film 31 was formed in each contact hole, thereby obtaining an FET. At this time, when the B concentration of the interface between the p+-type impurity diffusion layer 17 and the TiSi$_2$ layer 21 was measured in detail, although the value was increased to $1 \times 10^{20}$ cm$^{-3}$, the depth of the p+-type impurity diffusion layer 17 was 10 nm or less.

In the FET formed by the above method, when a contact resistivity between the TiSi$_2$ layer 21 and the p+-type impurity diffusion layer 17 was measured, the value was 23 Ω per contact area of 1 μm$^2$, and a perfect ohmic contact could be obtained. In addition, the junction leakage of the FET was equal to that of an FET in which no silicide film was formed.

Figure 4:
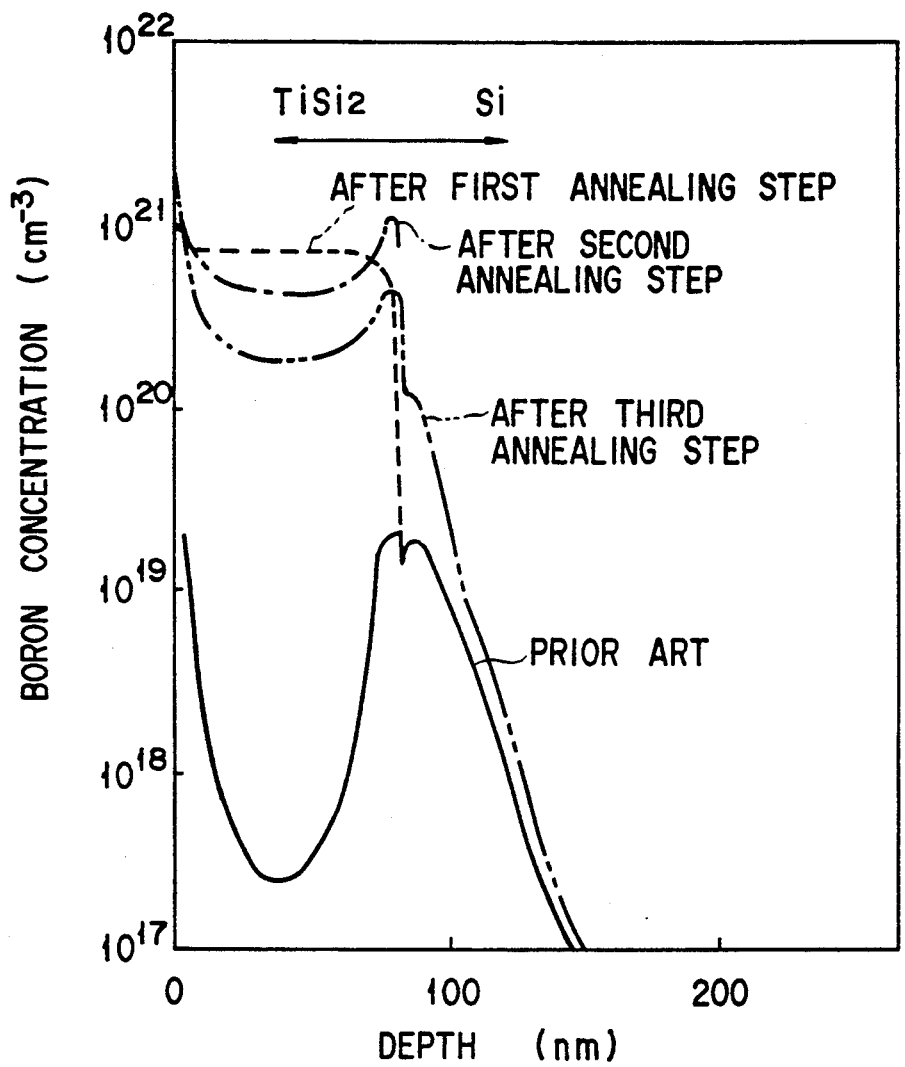
FIG. 4 is a graph showing a relationship between the depth of a substrate and a B concentration in the first aspect of the present invention.

In Example 1, a reason for preferably self-aligning the TiSi$_2$ layer 21 will be described below with reference to FIG. 4. FIG. 4 shows B concentration distributions in the method of Example 1 and in a conventional method. This graph shows the result obtained by analysis by using an SIMS method.

Before the TiSi$_2$ layer 21 is formed, the p+-type impurity diffusion layer 17 having a high B concentration, i.e., a peak B concentration of $5 \times 10^{20}$ cm$^{-3}$, is formed in the Si substrate 1. However, the Si substrate 1 is etched in accordance with formation of the TiSi$_2$ layer 21, B atoms of the high concentration region are doped in the TiSi$_2$ layer 21. The B atoms doped in the TiSi$_2$ layer 21 are greatly diffused outward in accordance with the movement of the interface between the TiSi$_2$ layer 21 and the Si substrate 1, and some of the B atoms are bonded to Ti atoms to produce stable TiB$_2$, thereby doping the B atoms in the TiSi$_2$ layer 21. As a result, as shown in FIG. 4, the final B concentration of the interface between the TiSi$_2$ layer 21 and the Si substrate 1 is decreased to a small value almost determined by the diffusion profile of initial B atoms and an amount of etched Si. Since the method up to this stage is the same as a method of forming a conventional silicide film, a sufficiently low contact resistivity is not obtained yet.

In Example 1, in addition to the above steps, the first annealing step in a B$_2$H$_6$ atmosphere was added. As shown in FIG. 4, when this step was used, B$_2$H$_6$ gas could be uniformly diffused in a high concentration in the TiSi$_2$ layer 21. In this first annealing step, since decomposition of the B$_2$H$_6$ gas could be suppressed by adding H$_2$ gas, B atoms were not precipitated but could be uniformly diffused. At this time, the B concentration in the TiSi$_2$ layer 21 was measured to be about $8 \times 10^{20}$ cm$^{-3}$.

When O$_2$ gas was added, and the second annealing step was performed, B atoms doped in the TiSi$_2$ layer 21 were piled up on the interface between the TiSi$_2$ layer 21 and the Si substrate 1 and on the surface of the TiSi$_2$ layer 21.

In this annealing step, even when annealing was performed in an atmosphere where O$_2$ gas was not added, the B concentration of the interface was increased. However, the increase in B concentration was considerably increased by adding the O$_2$ gas because the B atoms in the TiSi$_2$ layer 21 were dissociated. At this time, since an $SiO_2$ film was formed on the surface of the $TiSi_2$ layer 21, the B atoms were prevented from outward diffusion.

In addition, the third annealing step was added, the B atoms piled up on the interface between the $TiSi_2$ layer 21 and the Si substrate 1, as shown in FIG. 4, were diffused in the Si substrate 1, such that the high-concentration p+-type impurity diffusion layer 17 could be formed.

As described above, since the B atoms are diffused by all thermal diffusion phenomena, the Si substrate 1 can be prevented from damage, and preferable junction leakage characteristics can be obtained.

According to Example 1, high-concentration B atoms can be supplied to the interface between the $TiSi_2$ layer 21 and the Si substrate 1 without damage to the Si substrate 1, and the shallow p+-type impurity diffusion layer 17 which can be in good contact with an electrode wiring layer can be easily formed.

EXAMPLE 2

Figure 5A:
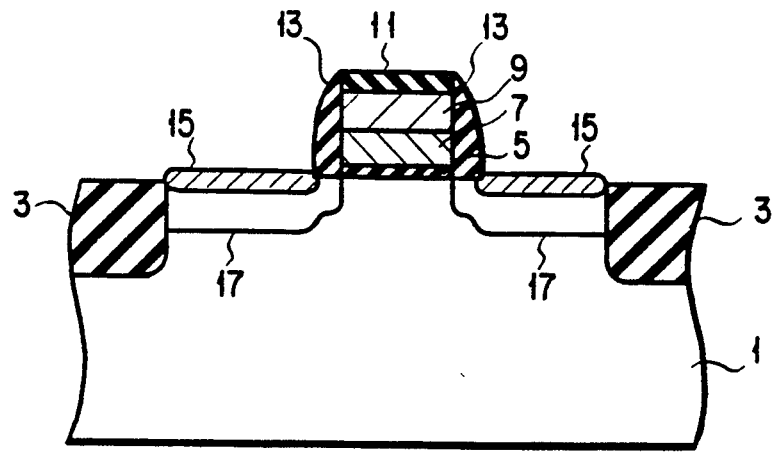
FIGS. 5A to 5C are sectional views showing the steps in manufacturing an FET according to another embodiment of the first aspect of the present invention.
Figure 5B:
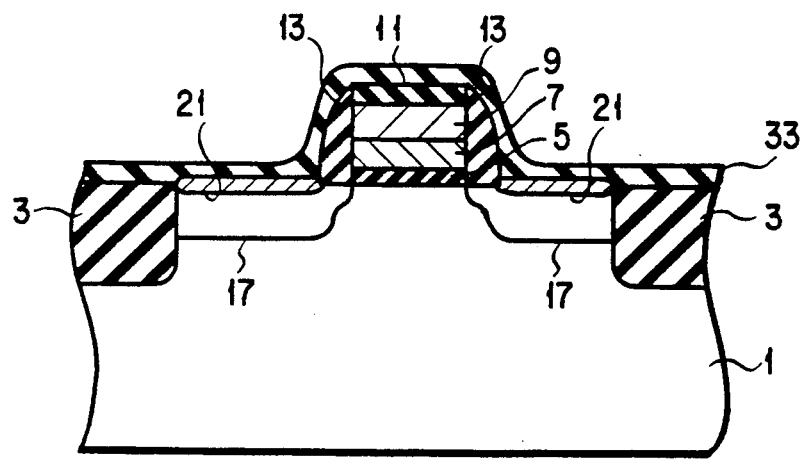
Figure 5C:
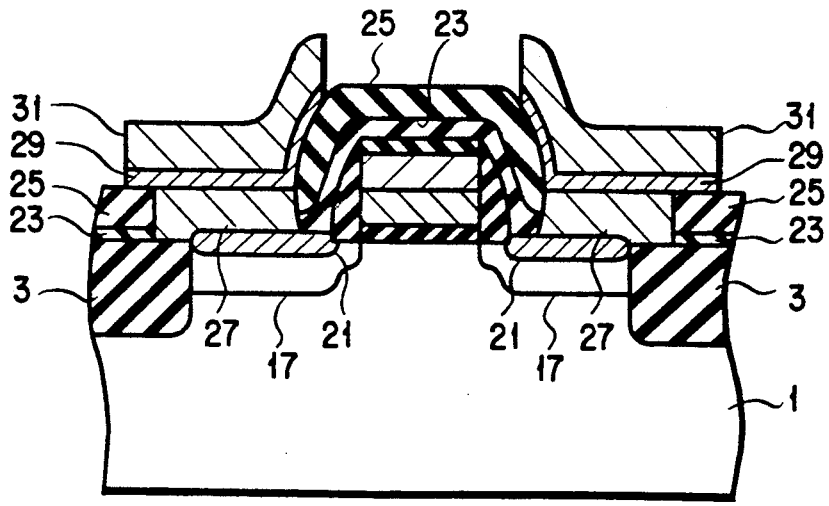

FIGS. 5A to 5C are sectional views showing the steps in manufacturing an FET according to another embodiment of the first aspect of the present invention. The same reference numerals as in FIGS. 2A to 3B denote the same parts of the FET shown in FIGS. 5A to 5C, and a description thereof will be omitted.

In Example 2, B ions are diffused in a $TiSi_2$ layer 21 and an interface between the $TiSi_2$ layer 21 and an Si substrate 1 by solid-phase thermal diffusion in place of vapor-phase thermal diffusion.

A shown in FIG. 5A, a gate oxide file 5 and a gate electrode having stacked films consisting of a polycrystalline layer 7, a $WSi_2$ layer 9, and an $SiO_2$ film 11 were formed on an element forming region which was formed on the n-type Si substrate 1 having a (100) plane as a major surface and surrounded by a field oxide film 3 having a thickness of 800 nm. Thereafter, a thin $SiO_2$ film (not shown) having a thickness of 10 nm was formed on the exposed Si surface of the Si substrate 1, and $BF_2+$ ions were implanted at an acceleration voltage of 35 keV and a dose of $5 \times 1^{-15}$ cm$^{-2}$. The steps up to this are the same as those of Example 1.

Lamp annealing was performed in an $N_2$ atmosphere at 1,050° C. for 20 minutes to form a shallow p+-type impurity diffusion layer 17 having a thickness of about 0.1 μm. When a method of forming an impurity diffusion layer using this lamp annealing was performed, a p+/n junction sharper than that obtained by normal furnance annealing could be obtained. As in Example 1, after a thin $SiO_2$ film was removed, a Ti film having a thickness of 400 nm was deposited, and the $TiSi_2$ layer 21 was formed using the following double-step annealing. That is, the double-step annealing included the first-step annealing in an $N_2$ atmosphere at 600° C. for 15 minutes, treatment in a $H_2SO_4$ solution and an $H_2)_2$ solution, and the second-step annealing in an $N_2$ atmosphere at 900° C. for 30 seconds.

As shown in FIG. 5B, the Si substrate on which the $TiSi_2$ layer 21 was formed was set in a cold-wall chamber and annealed in a gas mixture consisting of Ar gas and $B_2H_2$ gas at 450 °C. for 30 minutes. This step is called the first annealing step hereinafter. In this step, a B film 33 having a thickness of about 20 nm could be deposited on the entire surface of the substrate. At this time, the pressure of the chamber was set to be about0.5 Torr, and the flow rate of the $B_2H_6$ gas was set to be 200 sccm.

The gas mixture was switched to a gas mixture consisting of $H_2$ gas and $B_2H_6$ gas, and the substrate was annealed at 800° C. for 20 minutes. At this time, the flow rates of the $H_2$ gas and the $B_2H_6$ gas were set to be 2,000 sccm and 50 sccm, respectively. This step is called the second annealing step hereinafter. After the substrate was annealed in a 10% oxygen atmosphere at 600 °C. for 5 minutes to change the B film 33 into a $B_2O_3$ film, the $B_2O_3$ film was removed by water.

The second annealing step may be performed as follows. That is, the substrate is annealed in a gas mixture consisting of Ar gas, $O_2$ gas, and $B_2H_6$ gas at 850° C. for 20 minutes. At this time, a pressure is set to be 0.5 Torr, and the gas flow rates of the Ar, $O_2$, and $B_2H_6$ are set to be 2,000 sccm, 2 sccm, and 50 sccm, respectively.

As shown in FIG. 5C, as in Example 1, after a CVD-$SiO_2$ film 23 and a BPSG film 25 were sequentially deposited on the substrate, the substrate was lamp-annealed in an $N_2$ atmosphere at 1,000° C. for 10 seconds to increase the concentration of the p+-type impurity diffusion layer 17. Finally, contact holes were formed in source and drain regions, and electrode wiring layers each having stacked films consisting of a W film 27, a TiN film 29, and an Aλ-Si alloy film 31 were formed in the contact holes, thereby obtaining an FET.

The contact resistivity and junction leakage characteristics between the $TiSi_2$ layer 21 and the p+-type impurity diffusion layer 17 of the FET formed by the above method were measured. As a result, as in Example 1, it was confirmed to obtain preferable results.

In Example 2, H may have the following function. That is, when H atoms are bonded to Ti atoms, the Ti atoms are prevented from being bonded to B ions, or the Ti and B atoms are dissociated from each other, thereby uniformly distributing the B atoms in the $TiSi_2$ layer. For this reason, the B atoms are sufficiently supplied to the interface between the $TiSi_2$ layer and the diffusion layer, and the above effect can be obtained.

In Example 2, the B film 33 is formed by CVD using $B_2H_6$ gas. However, even when the B film 33 is formed by physical deposition such as sputtering, the same effect as described above can be obtained. At this time, when a spontaneous oxide film on the interface between the B film 33 and the $TiSi_2$ layer 21 is removed by Ar reverse sputtering or by $F_2$ gas, $Cλ_2$ gas, or $BCλ_3$ gas, doping can be performed with good reproducibility. In addition, when a substrate on which a BN film is deposited in place of the B film 33 is annealed, the same effect as described above can be obtained.

The first aspect of the present invention is not limited to Examples 1 and 2. For example, in Examples 1 and 2, after the p+type impurity diffusion layer 17 is formed on the Si substrate 1, the $TiSi_2$ layer 21 is formed, and a B concentration is increased. However, so-called post doping may be performed. That is, in the post doping, prior to the formation of the p+-type impurity diffusion layer, the $TiSi_2$ layer 21 may be formed, and the shallow p+-type impurity diffusion layer 17 may be formed in the same steps as described above.

After B ions may be doped in the $TiSi_2$ layer 21 by ion implantation of $FB_2$, the $TiSi_2$ layer 21 may be annealed in a gas mixture consisting of Ar, $H_2$, $F_2H_6$ to uniformly diffuse B ions in the $TiSi_2$ layer 21, and the B ions may be diffused in the substrate by the annealing step serving as a subsequent step as in Examples 1 and 2. In this case, when the range of the doped ions is completely controlled within the $TiSi_2$ layer 21, damage to the Si substrate can be minimized. In addition, an impurity such as B ions may be doped in the TiSi$_2$ layer 21 by another method.

EXAMPLE 3

Figure 6A:
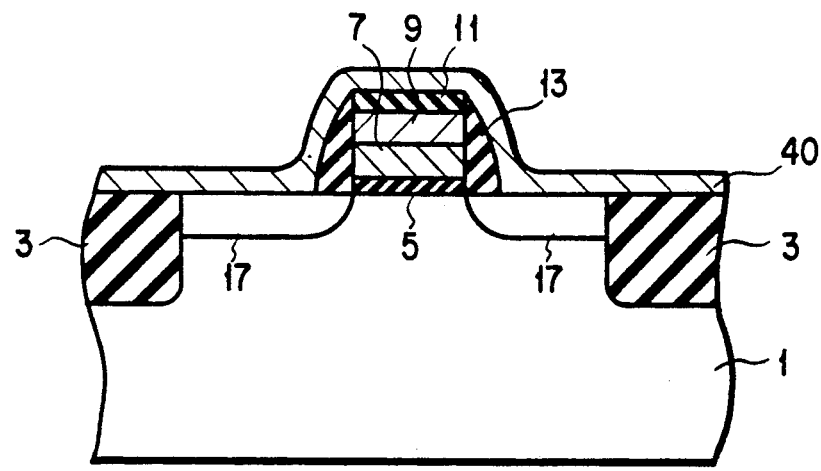
FIGS. 6A to 6C are sectional views showing the steps in manufacturing an FET according to an embodiment of the third aspect of the present invention.
Figure 6B:
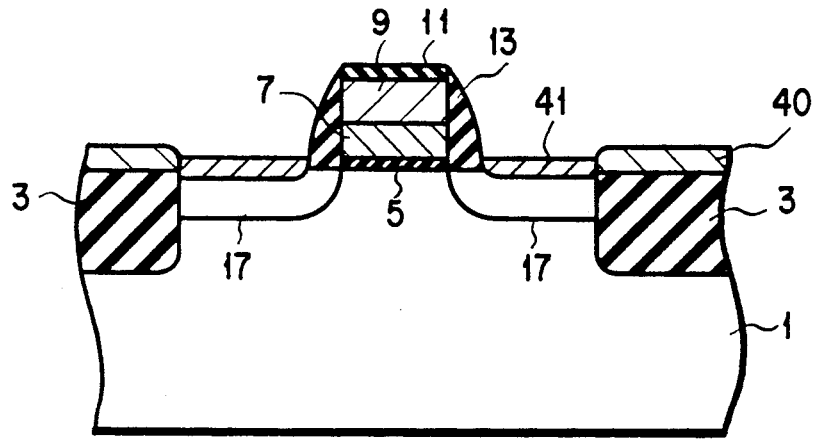
Figure 6C:
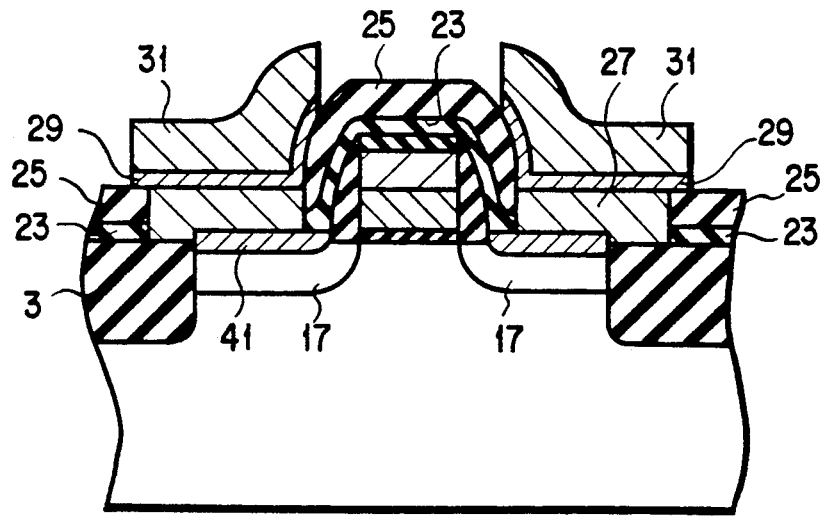

FIGS. 6A to 6C are sectional views showing the steps in manufacturing an FET according to an embodiment of the third aspect of the present invention.

As in Example 1, as shown in FIG. 6A, shallow p$^+$-type impurity diffusion layers 17 were formed in an Si substrate 1. Note that annealing was performed in an N$_2$ atmosphere at 1,000° C. for 20 seconds.

The Si substrate 1 was set in an HF vapor to remove a thin SiO$_2$ film 15 from the p$^+$-type impurity diffusion layer 17, and immediately, the Si substrate 1 was set in a vacuum device. In this manner, a spontaneous oxide film on the Si surface could be prevented from growth. The pressure of the vacuum device was decreased to a very high vacuum of 10$^{-8}$ Torr or less, and a Ti film 40 was formed on the p$^+$-type impurity diffusion layer 17 by sputtering deposition to have a thickness of about 20 nm.

The si substrate 1 was set in a cold-wall chamber and annealed in a gas mixture consisting of Ar gas and B$_2$H$_6$ at 600° C. for 20 minutes. At this time, the pressure in the chamber was set to be about 0.5 Torr, and the flow rate of the B$_2$H$_6$ gas was set to be 5 sccm. As a result of the annealing, as shown in FIG. 6B, the Ti film 40 was reacted with the Si substrate 1 to form a TiSi$_2$ layer 41 having a thickness of about 50 nm. At the same time, high-concentration B atoms were doped in the TiSi$_2$ layer 41.

After a non-reacted Ti film was selectively removed by a solution mixture consisting of H$_2$SO$_4$ and H$_2$O$_2$, a stacked film having a thickness of 1.0 μm and consisting of a CVD-SiO$_2$ film 23 serving as an insulating interlayer and the BPSG film 25 was formed on the entire surface of the resultant structure. Thereafter, annealing for reflow and gettering was performed to the Si substrate 1 in a POCλ$_3$ atmosphere at an atmospheric pressure and 850° C. for 60 minutes. Finally, as shown in FIG. 6C, contact holes were formed on source and drain regions, and an electrode wiring layers each having a stacked film consisting of a selection CFD-W film 27, a TiN film 29, and an Aλ-Si alloy film 31 were formed in the contact holes, thereby obtaining an FET.

When the contact resistivity between the TiSi$_2$ layer 41 and the p$^+$-type impurity diffusion layer 17 of the FET formed by the above method was measured, the value was about 20 Ω per a contact area of 1 μm$^2$, and a perfect ohmic contact could be obtained. In addition, the junction leakage of the FET was equal to that of an FET in which the TiSi$_2$ layer 41 was not formed.

Figure 7:
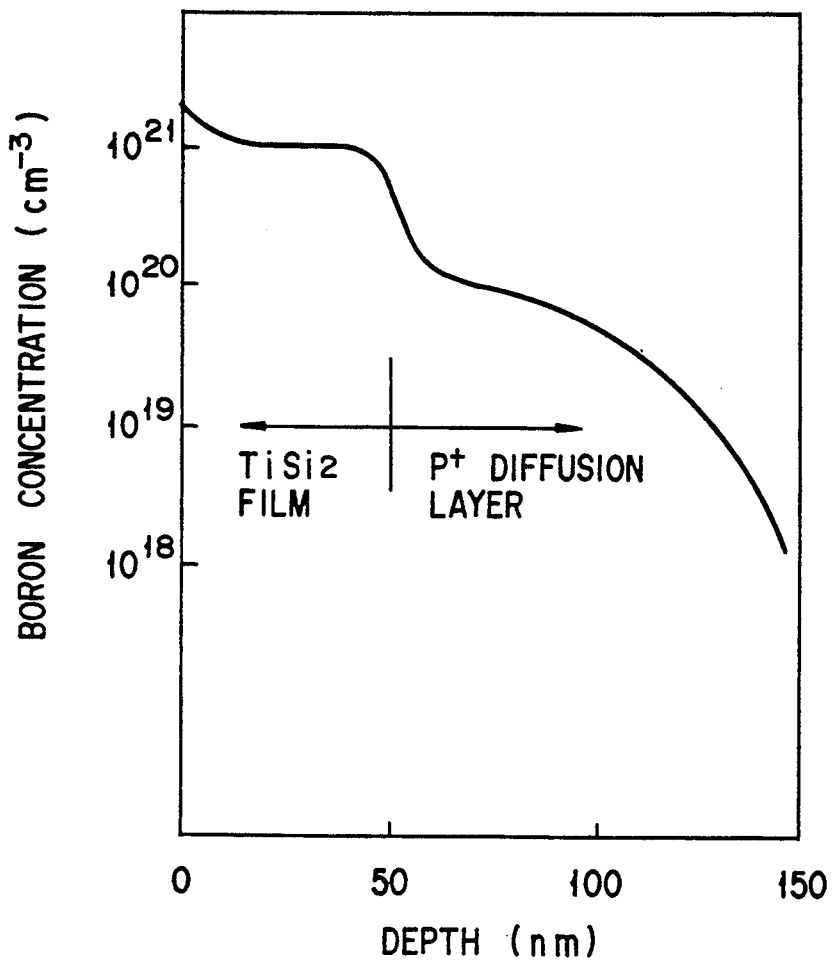
FIG. 7 is a graph showing a relationship between the depth of a substrate and a B concentration in the third aspect of the present invention.

This mechanism was examined as in Example 1. That is, when the B distribution in the TiSi$_2$ layer was evaluated by an SIMS method, as shown in FIG. 7, it was confirmed that the B atoms were uniformly distributed in the TiSi$_2$ layer 41 at a concentration of 1×10$^{21}$ cm$^{-3}$ or more. At this time, since the grain size of Ti silicide constituting the TiSi$_2$ layer 41 was small, i.e., 50 nm or less, B atoms were distributed in TiSi$_2$ grains at a high concentration, and some of the B atoms were precipitated on the grain boundary to produce TiB$_2$. The boron concentration of the p$^+$-type impurity diffusion layer 17 at the interface contacting with the TiSi$_2$ layer 41 was 1×10$^{20}$ cm$^{-3}$, and it was confirmed that the B concentration was not decreased even when the high-temperature gettering step was performed to the interface.

That is, according to the third aspect of the present invention, when the TiSi$_2$ layer is to be formed, annealing in an N$_2$ atmosphere, an Ar atmosphere, and a vacuum atmosphere is not performed, but annealing is performed in a B$_2$H$_6$ gas atmosphere. Therefore, formation of the TiSi$_2$ substrate and doping of high-concentration B atoms can be simultaneously performed.

Since formation energy of a Ti—B bond is generally higher than that of a Ti—Si bond, when a TiSi$_2$ layer is formed in a conventional technique, B atoms being on a TiSi$_2$/p$^+$-type Si interface are actively adsorbed in the TiSi$_2$ layer. For this reason, a low-resistance contact having thermal stability cannot be formed. However, in Example 3, since high-concentration B atoms are present in the TiSi$_2$ layer in advance, the B atoms are not absorbed in the TiSi$_2$ layer. In addition, rapid diffusion of the B atoms caused by precipitating TiB$_2$ on Ti-silicide grain boundary is prevented. As a result, the B concentration of the interface of the TiSi$_2$ layer and the Si substrate is not decreased, and a low-resistance contact having thermal stability can be formed.

As a method of doping B atoms in the TiSi$_2$ layer, ion implantation is used. However, the ion implantation generally has spread approximated by the Gaussian process in an implantation profile of ions. For this reason, it is difficult to uniformly dope B atoms in the direction of depth of the TiSi$_2$ layer. In addition, when the B concentration near the interface of the TiSi$_2$ layer and the Si substrate 1 is sufficiently increased, atoms are inevitably deeply doped in the Si substrate. As a result, the thickness of a junction portion is increased. At the same time, defects are formed in the Si substrate to cause the junction leakage. In contrast to this, according to Example 3, since thermal diffusion is used as the method of doping B atoms, the B atoms can be uniformly doped without causing any defect of the Si substrate. In addition, since the formation of the TiSi$_2$ layer and the doping are simultaneously performed, a decrease in B concentration on the interface can be suppressed during formation of the TiSi$_2$ layer.

As is apparent from the above mechanism, according to this embodiment, as a Ti film has a small thickness, the effect of the present invention is sufficiently enhanced. The thickness of the Ti film is preferably set to be 40 nm or less because, when the thickness of the Ti film excesses 40 nm, the silicide forming reaction and the B atom diffusion process are independently performed on the Ti/Si interface to degrade a doping effect. When the thickness of the Ti film is set to be 40 nm or less, since B atoms easily reach the Ti/Si interface, the silicide formation and doping are simultaneously performed. When the TiSi$_2$ layer is formed while the thickness of the Ti film is set to be 10 nm or less, an aggregation reaction occurs by annealing at 850° C., and the shape of TiSi$_2$ layer is changed into an island shape. However, according to the method of Example 3, even when the thickness of the Ti film is set to be 5 nm, since high-concentration B ions are doped in the TiSi$_2$ layer, no aggregation reaction occurs, thereby obtaining a proper TiSi$_2$ layer in which the B ions are uniformly doped.

According to Example 3, although a gas mixture of consisting of Ar and B$_2$H$_6$ is used as an annealing gas, H$_2$ gas may be added to the gas mixture. Even when a gas containing a dopant such as BCλ$_3$ is used in place of the B$_2$H$_6$ gas, the same effect as described above can be obtained.

EXAMPLE 4

Figure 8A:
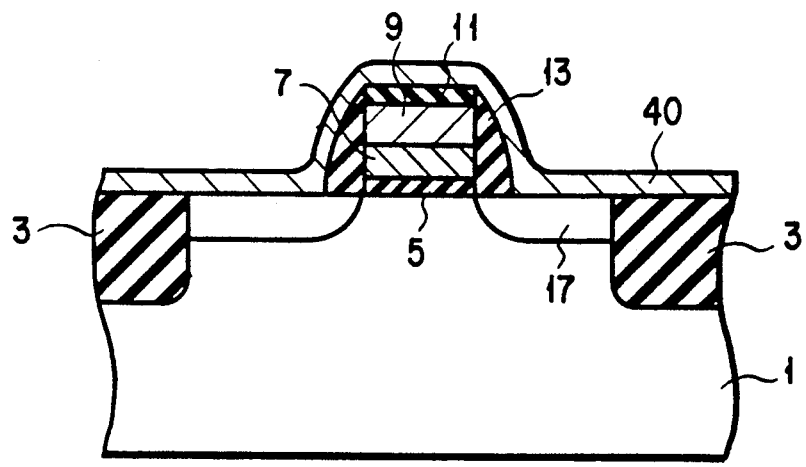
FIGS. 8A to 8C are sectional views showing the steps in manufacturing an FET according to another embodiment of the third aspect of the present invention.
Figure 8B:
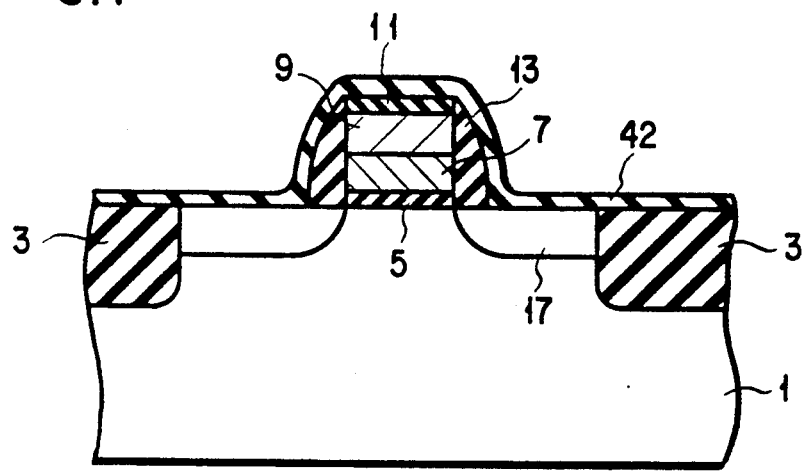
Figure 8C:
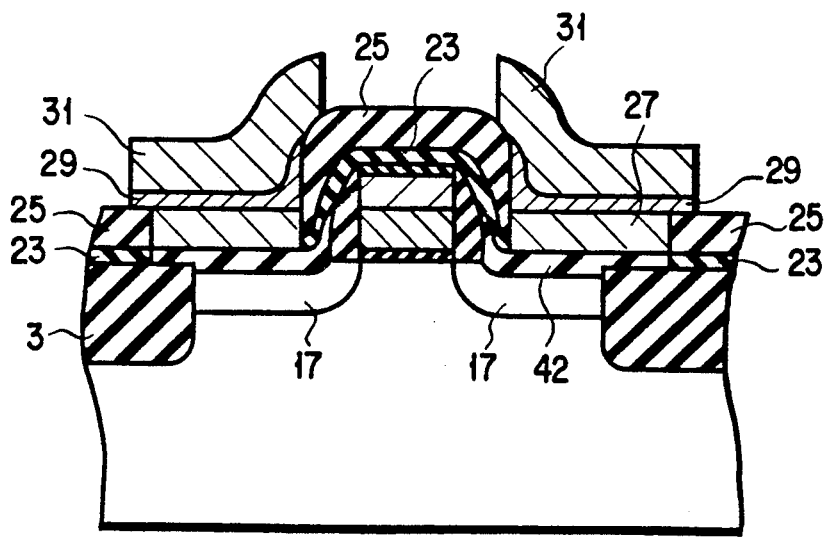

FIGS. 8A to 8C are sectional views showing the steps in manufacturing an FET according to another embodiment of the third aspect of the present invention.

As in Example 3, as shown in FIG. 8A, shallow $p^+$-type impurity diffusion layers 17 were formed in an Si substrate 1, and a Ti film 40 having a thickness of 20 nm was formed thereon.

The Si substrate 1 was set in a cold-wall chamber and annealed in a gas mixture consisting of Ar gas and $B_2H_6$ at 850° C. for 60 minutes. At this time, the pressure in the chamber was set to be about 0.5 Torr, and the flow rate of the $B_2H_6$ gas was set to be 10 sccm. As a result of annealing, as shown in FIG. 8B, the Ti film 40 was entirely changed into a $TiB_2$ film 42. That is, since the Ti film 40 was annealed in the high-concentration $B_2H_6$ gas atmosphere at a high temperature, high-concentration B atoms were not doped in the TiSi layer, but the $TiB_2$ film 42 was formed.

As shown in FIG. 8C, after the $TiB_2$ film 42 was patterned to a predetermined portion by photolithography, as in Example 3, insulating interlayers 23 and 25 were formed, and contact holes were formed. For example, electrode wiring layers each having a stacked film consisting of a selection CVD-W film 27, a TiN film 29, and an Aλ-Si alloy film 31 were formed, thereby obtaining an FET.

When the contact of the FET formed as in Example 3 was evaluated, it was confirmed that low-resistance characteristics having high thermal stability could be obtained as in Example 3.

A mechanism for forming the $TiB_2$ film 42 is considered as follows. That is, at the beginning of a reaction, B atoms are adsorbed to the interface between the Si substrate and the Ti film to form the $TiSi_2$ layer. However, since the annealing temperature, i.e., 850° C., is higher than that of Example 3, a rate of forming Ti-B bonds is higher than that of Ti-Si bonds, and most of Ti atoms are consumed in production of $TiSi_2$. In addition, since the production enthalpy of TiB is larger than that of $TiSi_2$, a reaction of $TiSi_2 + 2B \rightarrow TiB_2 + Si$ is performed at the high temperature.

On the other hand, on an insulating film, since Ti ions produce $TiB_2$ at first, an entirely uniform $TiB_2$ film is formed. When the $TiB_2$ layer film is formed, as in Example 3, the Ti atoms bonded to B atoms are not extracted. Therefore, it is regarded that a contact resistance is not increased even in a subsequent high-temperature annealing step. In addition, when the $TiB_2$ film is formed by the method of Example 4, since the Si surface is brought into contact with Ti atoms at first, a spontaneous oxide film is reduced. For this reason, a proper interface free from variations in washing process performed prior to deposition of Ti can be obtained.

The third aspect of the present invention can be achieved by modifying Example 4, as a matter of course. For example, when the annealing time in Example 4 is prolonged, B atoms can be diffused in the Si substrate through the $TiB_2$ film to form a $p^+$-type junction.

In Examples 3 and 4, a method of forming the $TiSi_2$ layer or the $TiB_2$ film on the entire surface of a $p^+$-type impurity diffusion layer has been described. However, these films may be applied to the barrier metal forming step of forming a barrier metal film in a contact hole. In this case, when a polysilicon film, a transition metal silicide film such as an NiSi film, a $TiSi_2$ film, a $WSi_2$ film, and an $MoSi_2$ film, or a film consisting of a refractory metal such as W and Ta may be used as a wiring layer, a low-resistance wiring layer which can withstand an annealing step at 600° C or more can be easily obtained, although a conventional Aλ alloy film cannot withstand the annealing step. For this reason, a device having a three-dimensional stacking structure can be easily formed.

As a modification of Example 4, after a Ti film having a thickness of 20 nm is formed by sputtering Ti, a Ti—B alloy which contains B having a concentration higher than that of $TiB_2$ is deposited by sputtering or CVD to form a 70-nm thick Ti—B alloy film. When the Ti—B alloy film is annealed at 700° to 800° C. for 30 to 60 seconds or at 550° to 650° C. for 30 minutes, $TiSi_2$ containing B can be obtained.

In Examples 3 and 4, Ti is used as a transition metal, and the Ti is deposited by sputtering. However, another transition metals may be deposited by another thin film deposition. More particularly, in Example 3, a transition metal silicide film doped with high-concentration B atoms can be formed, to obtain a thermally stable contact.

In Examples 1 to 4, although use of a $p^+$-type Si substrate has been described, the same technique as described above can be easily applied to an $n^+$-type Si substrate, as a matter of course. For example, although a Ti—B film is formed by using a gas mixture consisting of $B_2H_6$ gas and Ar gas in each of Examples 1 to 4, a Ti—As film can be formed on an $n^+$-type Si substrate by using $AsH_4$ gas in place of the $B_2H_6$ gas. In addition, B diffusion using $B_2H_6$ has also been described in Examples 1 to 4. However, when B diffusion using $BCl_3$ or an organic boron compound is performed, the same effect as described above can be obtained.

Although most of each of source and drain regions is changed into silicide in each of Examples 1 to 4, the method of the present invention can be applied to a small contact hole having a size of 0.5 $\mu m\square$ or less formed in an $n^{+-}$ or $p^+$-type impurity diffusion layer.

Although a $TiSi_2$ film is used as silicide in each of Examples 1 to 4, the present invention can be applied to other silicide films such as a $CoSi_2$ film, an $NiSi_2$ film, a $WSi_2$ film, and an $MoSi_2$ film.

EXAMPLE 5

FIGS. 9A to 9C are sectional views showing the steps in manufacturing a CMOS-FET according to an embodiment of the fifth aspect of the present invention.

A field oxide film 52 having a thickness of 800 nm was formed by a burying method on an n-type Si substrate 51 having a (100) plane as a major surface. As and B atoms serving as impurities were doped by high-acceleration ion implantation in element forming regions divided by the filed oxide film 52 to form an n-type well layer 53 and a p-type well layer 54. A gate oxide film 55 having a thickness of 10 nm, a doped polysilicon layer 56 having a thickness of 150 nm, a $WSi_2$ film 57 having a thickness of 150 nm, and a CVD-$SiO_2$ film 58 were sequentially formed on the Si substrate 51 in each element forming region. The resultant structure was etched to have a gate shape. A CVD-SiN film having a thickness of 150 nm was formed on the resultant structure, and each side wall of the gate was anisotropically etched to form an SiN film 59. Thereafter, $BF_2+$ ions were doped in the n-type well layer 53 at an acceleration voltage of 35 keV and a dose of $3 \times 10^{15}$ cm$^{-2}$, and ions were doped in the p-type well layer at an acceleration voltage of 60 keV and a dose of $3\times10^{15}$ cm$^{-2}$. Subsequently, the resultant structure was annealed in an N$_2$ atmosphere at 1,000° C. for 20 seconds to form shallow p$^+$- and n$^+$-type impurity diffusion layers 60 and 61 having a thickness of about 0.1 μm as shown in FIG. 9A. Thereafter, HF processing was performed to the entire surface of the Si substrate, and the Si substrate was washed with distilled water containing an oxygen concentration of 5 ppm or less, and, immediately, the Si substrate was set in a vacuum device. This processing could prevent a spontaneous oxide film from growing on the Si surface.

The pressure in the vacuum device was decreased to be $5\times10^{-7}$ Torr or less, and the Si substrate 51 was heated to 750° C. TiCλ$_4$ gas of 10 sccm, SiH$_4$ gas of 10 sccm, B$_2$H$_6$ gas of 1 sccm, and H$_2$ gas of 10 sccm were supplied to the vacuum device. At this time, the pressure in this vacuum device was set to be 0.1 Torr. As a result, as shown in FIG. 9B, a Ti-Si-B mixture film 62 having a thickness of about 500 Å was selectively formed on each of the p$^+$-type diffusion layers 60 and the n$^+$-type diffusion layers 61 at the same time.

A CVD-SiO$_2$ 63 and a PSG film 64 were formed on the entire surface of the resultant structure as an insulating interlayer. At this time, a total thickness of these films was set to be 1.0 μm. Gettering and annealing were performed to the resultant structure in a POCλ$_3$ atmosphere at 850° C. and an atmospheric pressure for 60 minutes. Thereafter, contact holes were formed in source and drain regions, and electrode wiring layers was formed by forming a selection CVD-W film 65, a TiN film 66, and an Aλ or Cu film 67 in the contact holes, thereby obtaining a MOS-FET as shown in FIG. 9C.

Figure 10:
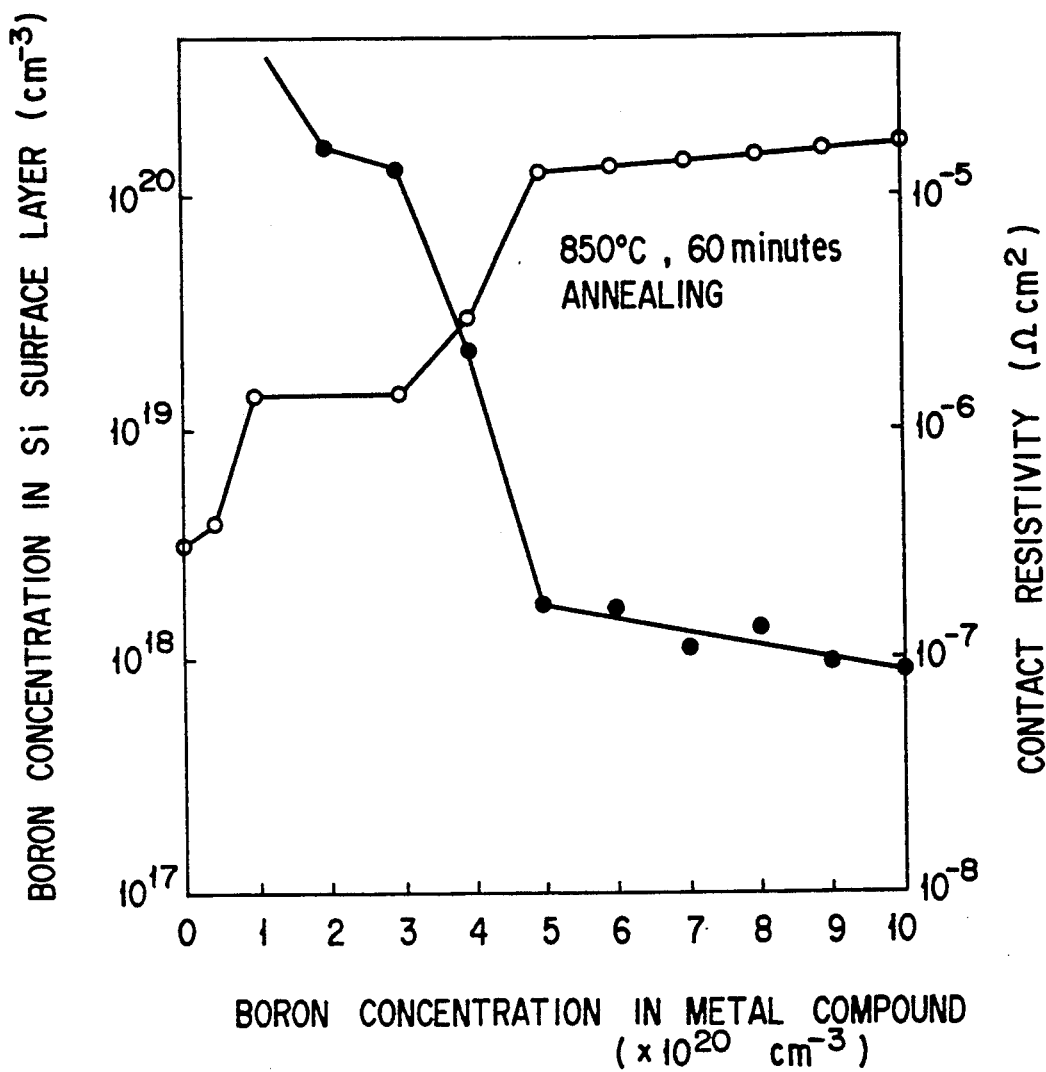
FIG. 10 is a graph showing a result obtained by performing an SIMS analysis to a metal compound film formed on a $p^+$-type diffusion layer.

When the Ti-Si-B mixture film 62 was measured by X-ray diffraction, it was confirmed that the film consisted of TiSi$_2$, and other Ti compounds were not detected. In addition, when a boron (B) concentration in the Ti-Si-B mixture film 62 was analyzed by an SIMS method, it was confirmed that boron was uniformly distributed in the film at a concentration of about $5\times10^{20}$ cm$^{-3}$. When a Ti-Si-B-C mixture film was formed in place of the Ti-Si-B mixture film, CH$_4$ gas was supplied to the vacuum device at a flow rate of 0.1 sccm, in addition to the above gas mixture. In this case, as shown in FIG. 10, it was confirmed that carbon was uniformly distributed in the Ti-Si-B-C mixture film at a concentration of about $10^{19}$ cm$^{-3}$. In this manner, the Ti-Si-B mixture film was formed by uniformly distributing high-concentration B atoms in an TiSi$_2$ film, and the Ti-Si-B-C mixture film is formed by uniformly distributing high-concentration B atoms and low-concentration C in a TiSi$_2$ film. These mixture films are also referred to as TiSi$_2$-B films hereinafter.

When the B concentration of the p$^+$-type diffusion layer at the interface contacting with the TiSi$_2$-B film was measured in detail, the B concentration was 1 to $2\times10^{20}$ cm$^{-3}$, and it was confirmed that the B concentration of the interface was not decreased although the TiSi$_2$-B film was subjected to high-temperature gettering. In addition, the state of the interface between the TiSi$_2$-B film and the n$^+$-type diffusion layer was examined in detail, and the following was confirmed. That is, B ions were not doped in the n$^+$-type diffusion layer from the TiSi$_2$-B film, and an As concentration of the interface was not different from that before the TiSi$_2$ film was formed.

When contact resistivities of the TiSi$_2$-B film and the p$^+$-type diffusion layer of the CMOS-FET manufactured as described above were measured, the value was 24 Ω Q per contact area of 1 μm$^2$, and a perfect ohmic contact could be obtained. In addition, the sheet resistance of the p$^+$-type diffusion layer was decreased to 4 Ω/□, and it was conformed that the transistor characteristics Gm was increased by 10% or more compared with the case wherein the TiSi$_2$-B film was not formed. In addition, the junction leakage of each of the n$^+$-type diffusion layer and the p$^+$-type diffusion layer was substantially equal to reference junction leakage. The C-doped TiSi$_2$-B film was a uniform film which had a uniform concentration distribution even when the film was subjected to annealing at 800° to 900° C.

According to the fifth aspect of the present invention, a mechanism in which a stable contact is obtained even when it is subjected to high-temperature annealing will be described below. In a conventional method of forming a TiSi$_2$ film containing no boron, a decrease in free energy caused by forming Ti—B compound is larger than a decrease in free energy caused by forming Ti-Si compound. For this reason, B ions present in an Si layer near the interface between the TiSi$_2$ film and the p$^+$-type Si substrate are actively adsorbed in the TiSi$_2$ film. Since a probability of bonding Ti atoms and B atoms is increased in proportion to an increase in annealing temperature, the TiSi$_2$ film is subjected to high-temperature annealing, so that a gettering step or a BPSG reflowing step, or extraction of the B atoms is promoted, and the B concentration of the interface is considerably decreased. As a result, a thermally stable low-resistance contact cannot be formed by a conventional technique.

In contrast to this, according to the fifth aspect of the present invention, since a TiSi$_2$-B film uniformly containing high-concentration B atoms is formed on a p$^+$-type Si substrate, saturation of Ti—B, Ti—C bonding prevents the substrate from extraction of B atoms. In addition, since a B concentration in the TiSi$_2$-B film is higher than that of the p$^+$-type Si substrate, thermal diffusion of B atoms from the substrate is prevented. As a result, the B concentration of the interface is not decreased, and a thermal)y stable low-resistance contact can be formed. In this case, since B atoms which can freely move in the TiSi$_2$-B film are not present, they are not doped in the Si substrate after annealing is performed. In addition, the electron concentration of the interface between the n$^+$-type diffusion layer an the Si substrate is kept to be stable, and an increase in n$^+$-type contact resistivity is prevented.

In this embodiment, when the flow rate of B$_2$H$_6$ gas is controlled, a B concentration in a region having a depth of about 200 Å near the surface of the TiSi$_2$-B film can be decreased to the B concentration in the p$^+$-type diffusion layer or less, i.e., $1\times10^{19}$ cm$^{-3}$ or less. In this case, after high-temperature annealing is performed for a long time, it is found that a few B ions are extracted from the p$^+$-type diffusion layer, because, when a TiSi$_2$-B film having a low B concentration is present near the surface, the B distribution in the film is reformed. Therefore, it is important that B atoms are uniformly distributed in the TiSi$_2$-B film.

As described above, according to the fifth aspect of the present invention, it was cleared that uniform distribution of high-concentration B atoms in the film was important. More particularly, when an B concentration was set to be $2\times10^{20}$ cm$^{-3}$ or more, more preferably $5\times10^{20}$ cm$^{-3}$ or more, an optimal result was obtained.

Figure 11:
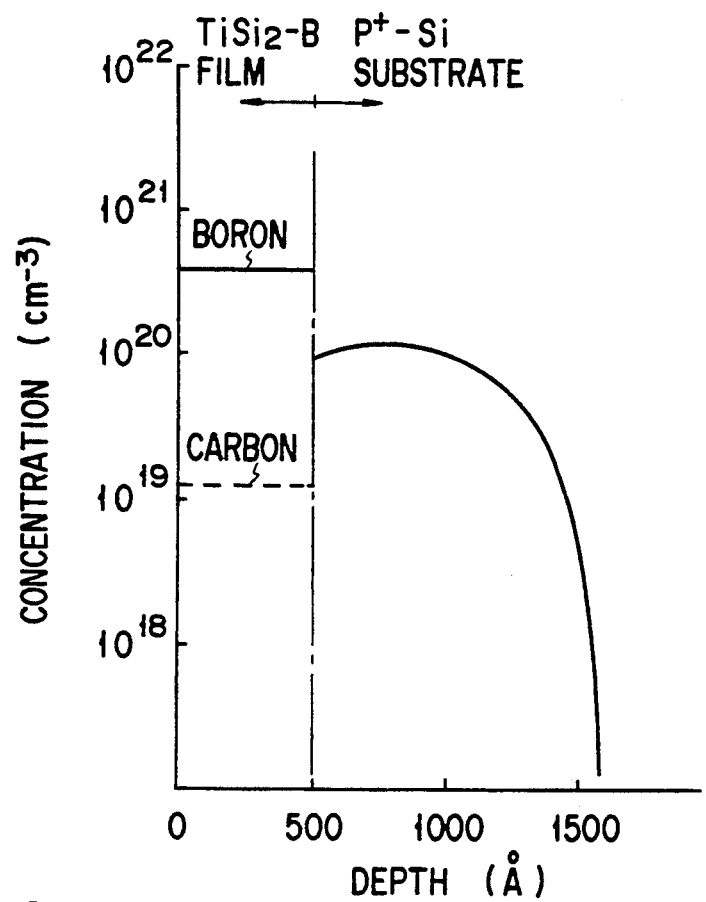
FIG. 11 is a graph showing a relationship between a B concentration in an Si surface layer and a B concentration in a metal compound formed in the fifth aspect of the present invention.

In this case, FIG. 11 shows a relationship between the B concentration of the TiSi$_2$-B film which is subjected to annealing at 850° C. for 60 minutes and the B concentration of the surface of the p$^+$-type Si substrate. As is apparent from FIG. 11, when the B concentration in the TiSi$_2$-B film is $2 \times 10^{20}$ cm$^{-3}$ or more, more preferably $5 \times 10^{20}$ cm$^{-3}$ or more, the B concentration in the surface of the Si substrate becomes $10^{20}$ cm$^{-3}$.

A method according to Example 5 is superior to a method of doping B atoms in a Ti silicide film by ion implantation in the following points.

That is, in the ion implantation, since the implantation profile of ions generally has spread approximated by the Gaussian distribution, it is difficult to uniformly dope in the Ti silicide film. Even if B atoms are attempted to be uniformly doped in the Ti silicide film by sequentially changing acceleration voltages, when the B concentration near the interface between the silicide film and the Si substrate is sufficiently high, the B atoms are deeply doped in the Si substrate. As a result, the junction depth is increased, and defects may be formed in the Si substrate, thereby probably causing junction leakage. On the other hand, when B atoms are doped only near the surface of the Ti silicide film, since a sufficient B concentration cannot be assured near the interface, the B atoms are extracted by TiSi$_2$ after high-temperature annealing is performed, and the conventional problem cannot be solved. In addition, in the ion implantation, since a mask such as a resist must be formed to prevent B ions from being doped in the n$^+$-type diffusion layer, the number of manufacturing steps is increased. Since the Ti silicide film does not have resistance to acid, the resist cannot be completely removed after the ion implantation is performed. For this reason, the Ti silicide film is contaminated by free ions such as sodium ions.

In contrast to this, in the method according to Example 5, since B ions can be uniformly distributed in the TiSi$_2$ film at a high concentration without substantially causing defects in the Si substrate, a decrease in p$^+$-type ion concentration can be perfectly suppressed after high temperature annealing is performed.

In Example 5, the TiSi$_2$-B film is selectively formed on only an impurity diffusion layer. However, even if the TiSi$_2$-B film is formed on the entire surface of the Si substrate and patterned to form a wiring layer in only a predetermined region, the same effect as described above can be obtained. In this case, prior to film formation in Example 5, after a spontaneous oxide film is removed by annealing in SiH$_4$ gas at 750° to 800° C., the same film forming gas as described above is supplied, and a uniform TiSi$_2$-B film can be formed. In addition, even if BC$\lambda_3$ gas or B(CH$_3$)$_3$ gas is used in place of the B$_2$H$_6$ gas, the same effect as described above can be obtained. TiC$\lambda_3$(CH$_3$)$_3$ gas is used in place of the B$_2$H$_6$ gas, the same effect as described above can be obtained. TiC$\lambda_3$(CH$_3$) gas, Ti[N(CH$_3$)$_2$]$_4$, or the like may be used as the TiC$\lambda_4$ gas. When a uniform TiSi$_2$-B film is formed by sputtering using a mixed-metal target such as Ti-Si-B or simultaneous deposition in place of CVD, the same effect as described above can be obtained.

In Example 5, since CH$_4$ gas is used as one of film forming gases, low-concentration C can be distributed in the formed TiSi$_2$-B film. For this reason, production of TiB$_2$ clusters is suppressed, and B ions can be uniformly distributed in the film. In addition, even if N$_2$ gas or NH$_3$ gas is added in place of the CH$_4$ gas, the same effect as described above can be obtained. That is, when an element such as C, N, or O which has the production enthalpy in production of a compound larger than that in production of TiSi$_2$ and can form a Ti conductive compound having the same conductivity as that of TiB$_2$ is added, production of TiB$_2$ clusters can be suppressed. Therefore the structure of the semiconductor device according to the present invention can be easily stabilized.

Figure 12:
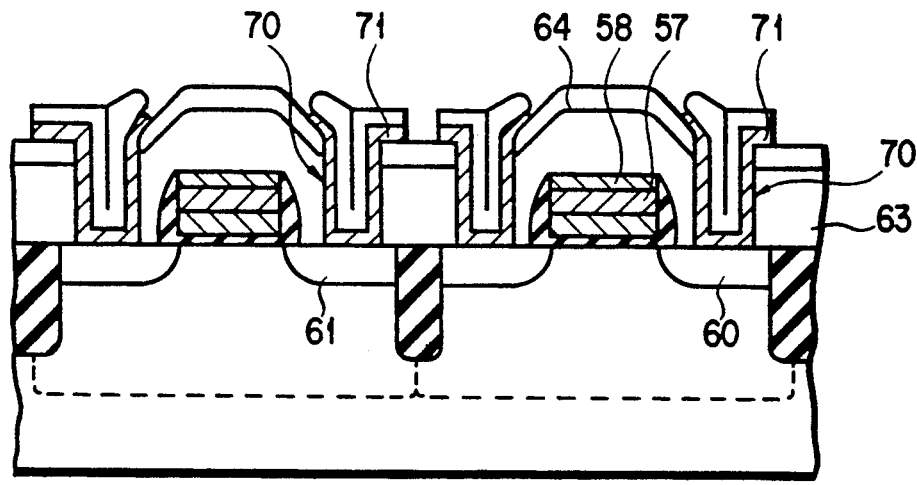
FIG. 12 a sectional view showing a step in manufacturing a CMOS-FET according to another embodiment of the fifth aspect of the present invention.

Various modifications of Example 5 can be effected as a matter of course. For example, Ti is deposited on the entire surface of a substrate by sputtering, and the resultant structure is annealed at 650° to 750° C. to form a TiSi$_2$ film on only an exposed Si portion. Thereafter, B ions can be uniformly distributed in a Ti silicide film by vapor-phase diffusion of B$_2$H$_6$ gas. In addition, although a method of forming the TiSi$_2$ film on the entire surface of the diffusion layer has been described in this embodiment, as shown in FIG. 12, this technique may be applied to the barrier metal forming step. That is, a TiSi$_2$-B film 71 may be formed in a contact hole 70.

The case wherein Ti is used has been described in Example 5. However, high-concentration B atoms may be doped in a film by using another transition metal such as zirconium (Zr), vanadium (V), tungsten (W), molybdenum (Mo), tantalum (Ta), or cobalt (Co) to form a so-called transition metal silicide-B film, and a thermally stable contact can be formed on an CMOS-FET.

As described above, according to the present invention, since an impurity is supplied from a metal compound layer to a substrate by thermal deposition, a semiconductor device having sufficiently low contact resistance between an electrode wiring layer and a shallow impurity layer can be obtained without any damage to the substrate or the like.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device comprising the steps of:
    forming an impurity diffusion layer of a second conductivity type on a semiconductor substrate of a first conductivity type,
    forming a Ti compound layer containing a constituent element of said semiconductor substrate on said impurity diffusion layer, and
    doping an impurity of the second conductivity type in said Ti compound layer by annealing in a reducing atmosphere containing a B$_2$H$_6$ gas and an H$_2$ gas;
    further comprising a second annealing step in an oxidizing atmosphere containing a B$_2$H$_6$ gas performed after annealing in an atmosphere containing a B$_2$H$_6$ gas and an H$_2$ gas.

2. A method according to claim 1, wherein the step of doping the impurity of the second conductivity type in said Ti compound layer is performed by vapor-phase diffusion.

3. A method according to claim 1, wherein the step of doping the impurity of the second conductivity type in said Ti compound layer is performed by solid-phase diffusion.

4. A method according to claim 3, wherein the solid-phase diffusion is performed by forming a thin film containing the impurity of the second conductivity type on said Ti compound layer and diffusion the impurity of the second conductivity type in said Ti compound layer.

5. A method according to claim 3, wherein the solid-phase diffusion is performed by diffusing the impurity of the second conductivity type in said Ti compound layer while the impurity of the second conductivity type is deposited on said Ti compound layer.

6. A method according to claim 1, wherein doping of the impurity element of the second conductivity type is performed to uniformly dope the impurity of the second conductivity type in said Ti compound layer.

7. The method of claim 1, further comprising a third annealing step in a nitrogen atmosphere, performed after said second annealing step in an oxidizing atmosphere containing $B_2H_6$.

8. A method of manufacturing a semiconductor device, comprising the steps of forming an impurity diffusion layer of a second conductivity type on a semiconductor substrate of a first conductivity type, forming a thin film consisting of a transition metal on said impurity diffusion layer, and annealing said semiconductor substrate having said thin film thereon in an atmosphere containing an impurity element of the second conductivity type to cause the transition metal to react with a semiconductor constituent element of said semiconductor substrate and to dope the impurity element of the second conductivity type in a transition metal compound layer formed by the reaction between the transition metal and the semiconductor constituent element.

9. A method according to claim 8, wherein a gas mixture consisting of a gas containing the impurity of the second conductivity type and a gas for suppressing decomposition of the gas containing the impurity of the second conductivity is included said atmosphere containing the impurity element of the second conductivity type.

10. A method according to claim 9, wherein the gas mixture consists of $B_2H_6$ gas and $H_2$ gas.

11. A method according to claim 8, wherein doping of the impurity element of the second conductivity type is performed to uniformly dope the impurity of the second conductivity type in said transition metal compound layer.

12. A method according to claim 8, wherein the transition metal is at least one member selected from the group consisting of Ti, V, W. Mo, Ta, and Co.

13. A method according to claim 8, wherein B is used as the impurity element, and Ti is used as the transition metal.

* * * * *